United States Patent
Pan et al.

(10) Patent No.: US 8,578,255 B1
(45) Date of Patent: Nov. 5, 2013

(54) PRIMING OF METRICS USED BY CONVOLUTIONAL DECODERS

(75) Inventors: Zhengjun Pan, High Wycombe (GB); Volker Mauer, Princes Risborough (GB)

(73) Assignee: Altera Corporation, San Jose, CA (US)

( * ) Notice: Subject to any disclaimer, the term of this patent is extended or adjusted under 35 U.S.C. 154(b) by 905 days.

(21) Appl. No.: 12/339,482

(22) Filed: Dec. 19, 2008

(51) Int. Cl.
*H03M 13/03* (2006.01)
*H03M 13/00* (2006.01)

(52) U.S. Cl.
USPC ........... 714/796; 714/755; 714/758; 714/794; 375/341

(58) Field of Classification Search
None
See application file for complete search history.

(56) References Cited

U.S. PATENT DOCUMENTS

| | | | |
|---|---|---|---|
| 6,189,126 B1 | 2/2001 | Ulmer et al. | |
| 6,754,290 B1* | 6/2004 | Halter | 375/340 |
| 6,813,743 B1* | 11/2004 | Eidson | 714/795 |
| 7,613,990 B1 | 11/2009 | Wilkie et al. | |
| 2001/0021233 A1 | 9/2001 | Jin | |
| 2002/0007474 A1* | 1/2002 | Fujita et al. | 714/755 |
| 2002/0097816 A1* | 7/2002 | Sim | 375/341 |
| 2002/0118777 A1* | 8/2002 | Blankenship et al. | 375/341 |
| 2003/0028846 A1 | 2/2003 | Garrett | |
| 2003/0149928 A1* | 8/2003 | Ting et al. | 714/755 |
| 2004/0025103 A1* | 2/2004 | Obuchii et al. | 714/755 |
| 2005/0157823 A1 | 7/2005 | Sudhakar | |
| 2005/0172204 A1* | 8/2005 | Lin | 714/755 |
| 2006/0005111 A1 | 1/2006 | Hepler et al. | |
| 2007/0030926 A1 | 2/2007 | Brown et al. | |
| 2007/0044008 A1 | 2/2007 | Chen et al. | |
| 2007/0055919 A1 | 3/2007 | Li et al. | |
| 2007/0157066 A1 | 7/2007 | Concil et al. | |
| 2007/0177696 A1* | 8/2007 | Chen et al. | 375/341 |
| 2008/0092011 A1* | 4/2008 | Ikeda | 714/755 |
| 2008/0152045 A1 | 6/2008 | Efimov et al. | |
| 2009/0132896 A1 | 5/2009 | Valadon | |
| 2009/0228768 A1 | 9/2009 | Mauer | |
| 2009/0319862 A1* | 12/2009 | Nguyen | 714/752 |
| 2010/0054375 A1 | 3/2010 | Lo et al. | |
| 2011/0047436 A1 | 2/2011 | Lee et al. | |
| 2011/0271166 A1* | 11/2011 | Hepler et al. | 714/763 |

OTHER PUBLICATIONS

Gambe, H. et al. "An Improved Sliding Window Algorithm for Max-Log-MAP Turbo Decoder and Its Programmable LSI Implementation," IEICE Trans. Electron., Mar. 2005, vol. E88-C, No. 3 , pp. 403-412.

Montorsi, G. "Design of Fixed-Point Iterative Decoders for Concatenated Codes with Interleavers," IEEE Journal on Selected Areas in Communications, May 2001, vol. 19, No. 5., pp. 871-882.

Sadjadpour, Hamid R., Maximum a posteriori decoding algorithms for turbo codes, Jul. 2000, Proc. SPIE vol. 4045, p. 73-83, Digital Wireless Communication II, Raghuveer M. Rao; Soheil A. Dianat; Michael D. Zoltowski; Eds.

* cited by examiner

*Primary Examiner* — Albert Decady
*Assistant Examiner* — Justin R Knapp
(74) *Attorney, Agent, or Firm* — Mauriel Kapouytian Woods LLP; Ararat Kapouytian (57) ABSTRACT

A sequence estimator is described. In one embodiment, the sequence estimator includes a plurality of maximum a posteriori probability (MAP) decoding engines each arranged to process a series of windows of a transmitted signal where state metrics produced for an end of one window by one decoding engine are re-used for the initialization of a state metric calculation process performed by another decoding engine on another window of the signal.

21 Claims, 9 Drawing Sheets

PRIMING OF METRICS USED BY CONVOLUTIONAL DECODERS

BACKGROUND

The invention relates to the decoding of encoded data.

When data is moved from place to place, it is often the case that the transfer process will create errors in the data. Accordingly, it is common practice to encode data to mitigate the impact of errors introduced by a transfer process. Normally, encoded data has to be decoded in order to be put to its intended use. Both the encoding and decoding of data represent a processing burden. This burden can be quite heavy in the case of modern encoding schemes. The use of encoding schemes to protect against data transfer errors is widespread but such use is particularly heavy in the telecommunications industry, especially in the wireless communications sector.

There exists a wide range of data encoding techniques and complimentary data decoding techniques. In the wireless communications sector, convolutional encoding techniques are commonly used. Various techniques can be used for decoding a convolutionally encoded signal, such as the Viterbi algorithm, the MAP (maximum a posteriori probability) algorithm and the log-MAP algorithm. Convolutional encoding and Viterbi, MAP, log-MAP and max-log-MAP decoding algorithms will be well known to those skilled in the art of wireless telecommunications engineering but readers less familiar with the field can find an introduction to these subjects in the book entitled "Digital Communications", by John G. Proakis, fourth edition, published by McGraw-Hill.

A paper by Gambe et at entitled "An Improved Sliding Window Algorithm for Max-Log-MAP Turbo Decoder and Its Programmable LSI Implementation" (IEICE Trans. Electron., Vol. E88-C, 3 Mar. 2005, pages 403 to 412) describes a sliding window approach to max-log-MAP turbo decoding in which certain metrics calculated in one turbo decoding iteration are carried over to provide window commencement metrics for a subsequent iteration.

SUMMARY

According to one aspect, an embodiment of the invention provides a sequence estimator for re-estimating a transmitted signal from an existing estimate of the transmitted signal, the estimator including a plurality of decoding engines, control logic and a memory. Each engine is arranged to re-estimate in series a plurality of sections of the transmitted signal. Each engine, in producing a new estimate of a given section of the transmitted signal, is arranged to perform on the existing estimate of the given section a type of MAP decoding in which state metrics of first and second types are calculated through the given section in opposing directions. The control logic is arranged to store into the memory the second type metrics as produced by a first one of the decoding engines for an end-point of a first one of the sections. The control logic is arranged to retrieve the stored second metrics and use them to initialise the calculation of second type metrics in a second one of the decoding engines for a second one of the sections.

This embodiment of the invention also provides a method of re-estimating a transmitted signal from an existing estimate of the transmitted signal using a plurality of decoding engines. Each engine re-estimates in series a plurality of sections of the transmitted signal. Each engine, in producing a new estimate of a given section of the transmitted signal, is arranged to perform on the existing estimate of the given section a type of MAP decoding in which state metrics of first and second types are calculated through the given section in opposing directions. Metrics of the second type as produced by a first one of the decoding engines for an end-point of a first one of the sections are stored into a memory. These metrics are retrieved and used to initialise the calculation of second type metrics in a second one of the decoding engines for a second one of the sections.

By re-using the second type metrics produced by a first engine for a first section to initialise the processing of second type metrics for a second section being processed by a second engine, the re-estimation process is thus provided with an accuracy enhancement that is economical in terms of consumption of processing resources.

In certain embodiments, the first and second metric types are $\alpha$ and $\beta$ metrics, respectively, of a MAP algorithm.

According to another aspect, an embodiment of the invention provides a sequence estimator comprising a plurality of MAP decoding engines each arranged to process a series of windows of a transmitted signal wherein state metrics produced for an end of one window by one decoding engine are re-used for the initialisation of a state metric calculation process performed by another decoding engine on another window of the signal.

This embodiment of the invention also provides a method of estimating a sequence using a plurality of MAP decoding engines each arranged to process a series of windows of a transmitted signal. In one decoding engine, state metrics are produced for an end of one window. These are then re-used for the initialisation of a state metric calculation process performed by another decoding engine on another window of the signal.

By re-using the metrics produced by a first engine for one window to initialise the processing of metrics for a second window by a second engine, the estimation process is thus provided with an accuracy enhancement that is economical in terms of consumption of processing resources.

The invention also extends to data carriers containing instructions for causing data processing equipment to perform a signal processing method according to the invention.

A sequence estimator according to the invention may be implemented in, for example, a field programmable gate array (FPGA) or an application specific integrated circuit (ASIC).

A sequence estimation process according to the invention may be used in a turbo decoder in, for example, a base station of a cellular telecommunications network.

BRIEF DESCRIPTION OF THE DRAWINGS

The novel features of the invention are set forth in the appended claims. However, for purpose of explanation, several aspects of particular embodiments of the invention are described by reference to the following figures:

DETAILED DESCRIPTION

The following description is presented to enable any person skilled in the art to make and use the invention, and is provided in the context of particular applications and their requirements. Various modifications to the exemplary embodiments will be readily apparent to those skilled in the art, and the generic principles defined herein may be applied to other embodiments and applications without departing from the spirit and scope of the invention. Thus, the present invention is not intended to be limited to the embodiments shown, but is to be accorded the widest scope consistent with the principles and features disclosed herein.

Figure 1:
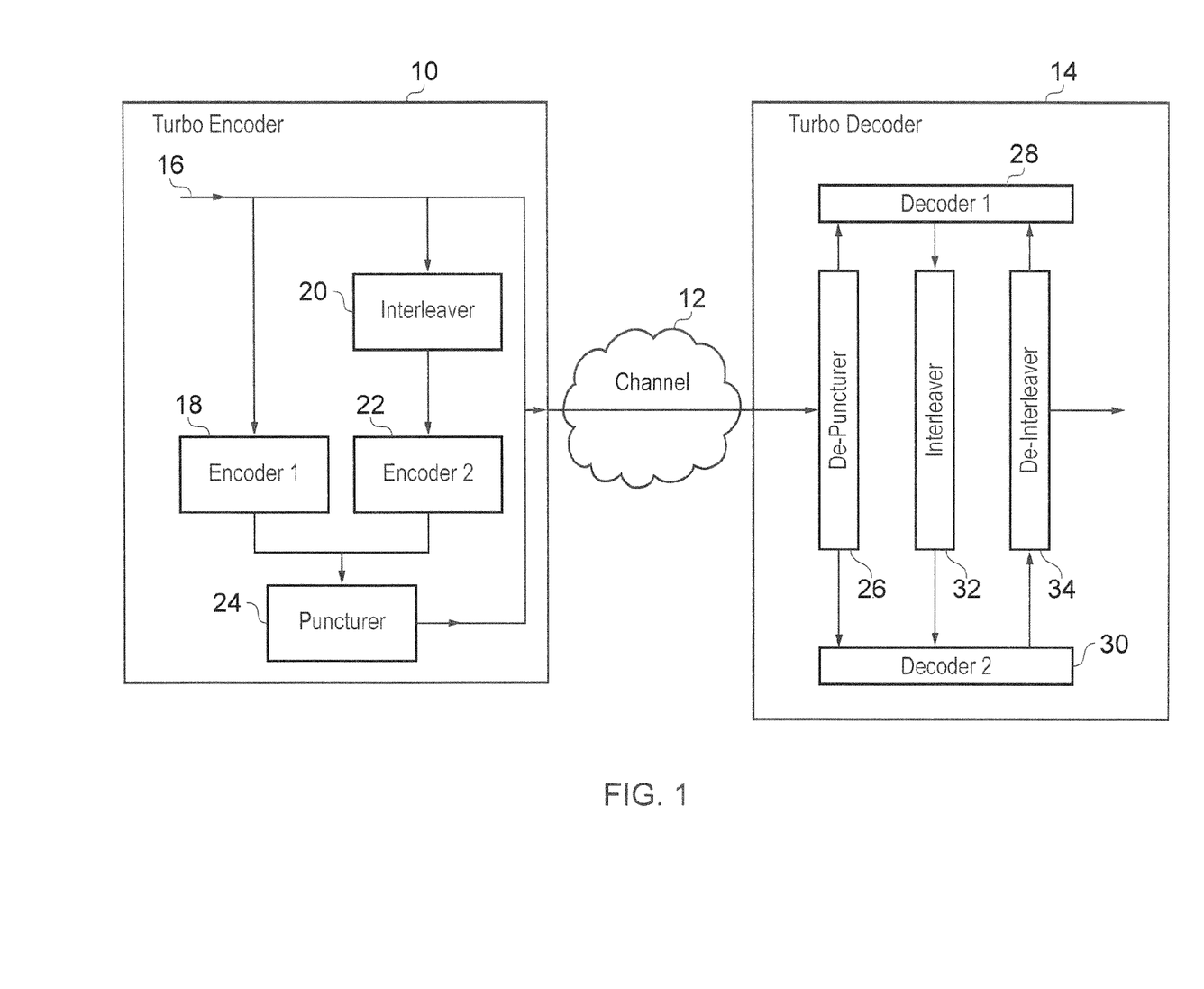
FIG. 1 is a block diagram schematically illustrating a turbo encoder and a turbo decoder.

FIG. 1 illustrates a turbo encoder 10 arranged to transmit a signal through a channel 12 to a turbo decoder 14. In practice, the signal travelling through the channel 12 is, as will be appreciated by persons skilled in the digital communications field, modulated onto a radio frequency (RF) carrier signal but the modulation process, and the corresponding demodulation process, are omitted here for reasons of brevity and clarity. It will also be apparent to the readers skilled in the digital communications field that the elements shown within the encoder 12 and the decoder 14 represent functions that are performed by the encoder or, as the case may be, the decoder and do not necessarily represent actual components. This holds true for most of the elements shown in most of the figures, as the skilled person will appreciate.

In the turbo encoder 10, a signal 16 is encoded for transmission through the channel 12 to the turbo decoder 14. The signal 16 is constituted by a sequence, or block, of bits. The signal 16 is supplied in parallel to a first constituent encoder 18 and to an interleaver 20. The interleaver 20 reorders the data in the signal 16 and supplies the result to a second constituent encoder 22. The constituent encoders 18 and 22 are convolutional encoders. The constituent encoder 18 produces a convolutionally encoded version of the input signal 16 and supplies this convolutionally encoded signal to a puncturer 24. Likewise, constituent encoder 22 convolutionally encodes an interleaved version of the input signal 16 and supplies the resulting convolutionally encoded signal as another input to the puncturer 24. The convolutionally encoded signals that are produced by the constituent encoders 18 and 22 are streams of parity bits that are intended to be transmitted with the signal 16 through the channel 12. The puncturer 24 deletes selected bits of the parity bits produced by the constituent encoders 18 and 22 before the parity information is combined with the signal 16 to produce the signal that is to be transmitted through the channel 12. The puncturer 24 performs the selective deletion of parity bits in accordance with a predetermined policy in order to provide a desired code rate to the signal that is transmitted through the channel 12.

In the turbo decoder 14, the signal acquired from the channel 12 is supplied to a depuncturer 26. The depuncturer 26 pads the signal acquired from the channel 12 with dummy bits in the positions where information was deleted by the puncturer 24 in the turbo encoder 10. The depunctured signal produced by the depuncturer 26 comprises three streams of information. These are an estimate of the signal 16, an estimate of the output of constituent encoder 18 and an estimate of the output of constituent encoder 22. Typically, the first two of these streams are applied to constituent decoder 28 and the third one is applied to constituent decoder 30.

Initially, the constituent decoder 28 applies the max-log-MAP algorithm to the information that it receives from the depuncturer 26 in order to produce a new estimate of the signal 16. This new estimate of signal 16 is then interleaved by interleaver 32 and is provided to constituent decoder 30. The constituent decoder applies the max-log-MAP algorithm to this interleaved version of an estimate of signal 16 in order to produce an estimate of the output signal of interleaver 20 in the turbo encoder 10. Next, this estimate of an estimate of the output signal of interleaver 20 is deinterleaved by deinterleaver 34 and is provided to constituent decoder 28. The operations described thus far amount to one turbo decoding iteration in exemplary turbo decoder design presented in FIG. 1. Successive turbo decoding iterations are performed until the estimate of signal 16 emerging from deinterleaver 34 is deemed to be sufficiently reliable and is released by the turbo decoder 14 to downstream processing units and is put to its intended use.

The constituent decoders 28 and 30 both use the max-log-MAP algorithm and the nature of that algorithm will now be described, in overview, by reference to FIG. 2.

Figure 2:
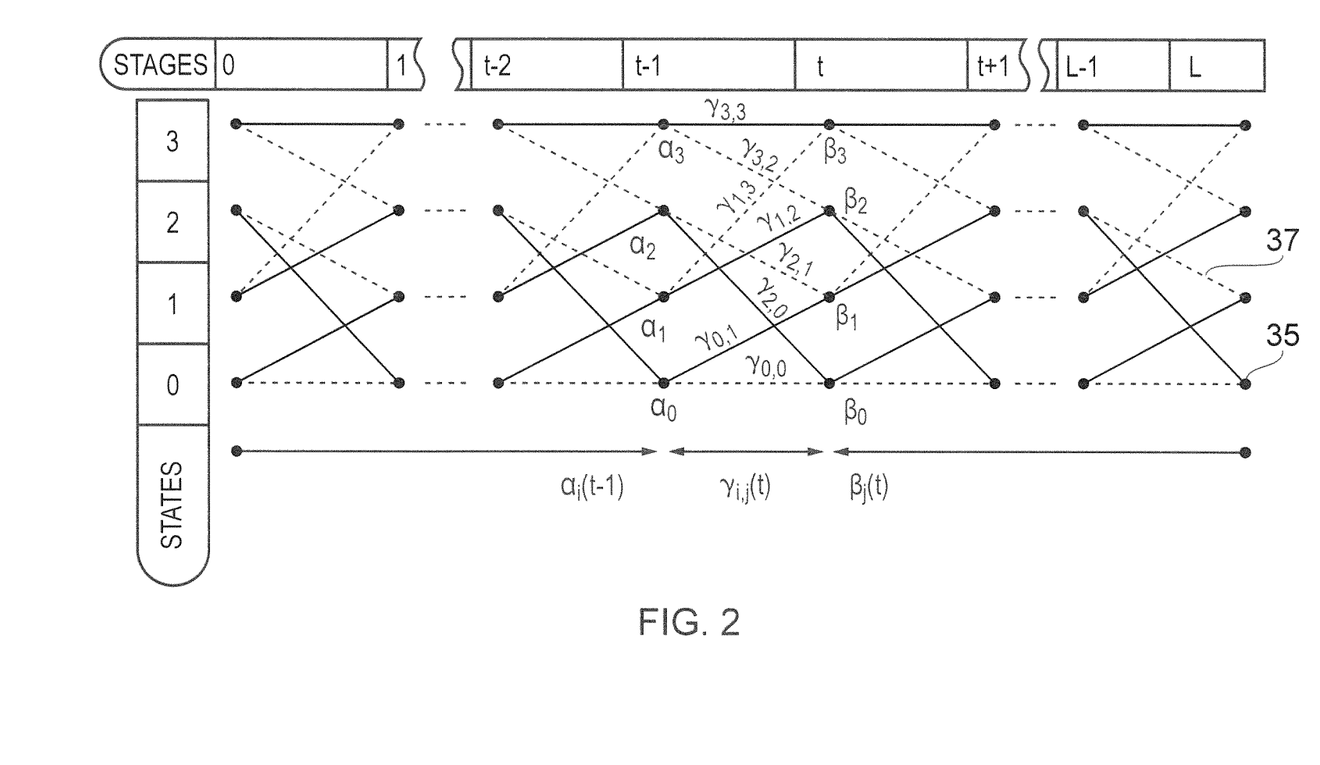
FIG. 2 illustrates a portion of a decoding trellis in an implementation of a MAP, log-MAP or max-log-MAP trellis.

FIG. 2 shows a trellis diagram for a sequence of L soft decisions that is an estimate of a sequence of L bits produced by a four state convolutional encoder in response to an initial sequence of L bits. In accordance with accepted convention, the L+1 stages of the trellis are shown horizontally and the four states are shown vertically within each stage, numbered from 0 to 3. To estimate the initial sequence using the max-log-MAP algorithm, so-called $\alpha$ and $\beta$ metrics are calculated, in (natural) logarithmic form, for the nodes in the trellis using branch metrics, which are also in (natural) logarithmic form and which are generally indicated $\gamma_{m,n}$ in FIG. 2, with m and n indicating the states in the left-hand and right-hand stages that are connected by the transition to which a branch metric relates. In this document, whenever $\alpha$ metrics, $\beta$ metrics or branch metrics are mentioned henceforth in the context of the max-log-MAP algorithm, it is to be understood that, unless it is expressly stated to the contrary, the metrics are in (natural) logarithmic form. These $\alpha$ and $\beta$ metrics are then used to calculate log likelihood ratios (LLRs) as estimates for the bits of the initial sequence.

The $\alpha$ metrics are calculated for the various positions along the trellis in a recursive fashion starting from initial values provided for stage 0 of the trellis, which corresponds to an initial state of the encoder just prior to the application of the first bit of the initial sequence. For each of stages 1 to L, $\alpha$ metrics are calculated for the states by performing so-called metric update operations (MUOs), which use the $\alpha$ metrics of the preceding stage and branch metrics $\gamma_{m,n}$ for the allowed transitions between states in the current and previous stages of the trellis.

The $\beta$ metrics are calculated for the various positions along the trellis in a recursive manner analogous to the calculation of the $\alpha$ metrics but in the opposition direction starting from initial $\beta$ metric values provided for stage L of the trellis, which corresponds to the state of the encoder after receipt of the final bit of the initial sequence.

The production of $\alpha$ metrics for a stage of the trellis from the $\alpha$ metrics of the preceding trellis stage relies on the use of MUOs. Likewise, MUOs are central to updating the $\beta$ metrics when moving from one trellis stage to another. The conduct of these MUOs will now be explained by reference to the transitions linking stages t and t−1 of the trellis shown in FIG. 2.

The branch metrics for the allowed transitions between the trellis states are evaluated for the transition between stages t and t−1 in a known manner. Each of the α metrics for stage t is calculated from two of these branch metrics and two of the α metrics for stage t−1 in a MUO. Likewise, each of the β metrics for stage t−1 is calculated from two of these branch metrics and two of the β metrics for stage t in a MUO. The details of a MUO for calculating an α or, as the case may be, a β metric from preceding metrics according to the max-log-MAP algorithm will be known to the skilled person and will not be discussed further at this point.

The details of the max-log-MAP algorithm, such as the calculation of the branch metrics and the LLRs, will be known to readers skilled in the art and will not be described here. Now that the general principles of turbo decoding and the max-log-MAP algorithm have been outlined, a receiver making use of these concepts will now be described.

Figure 3:
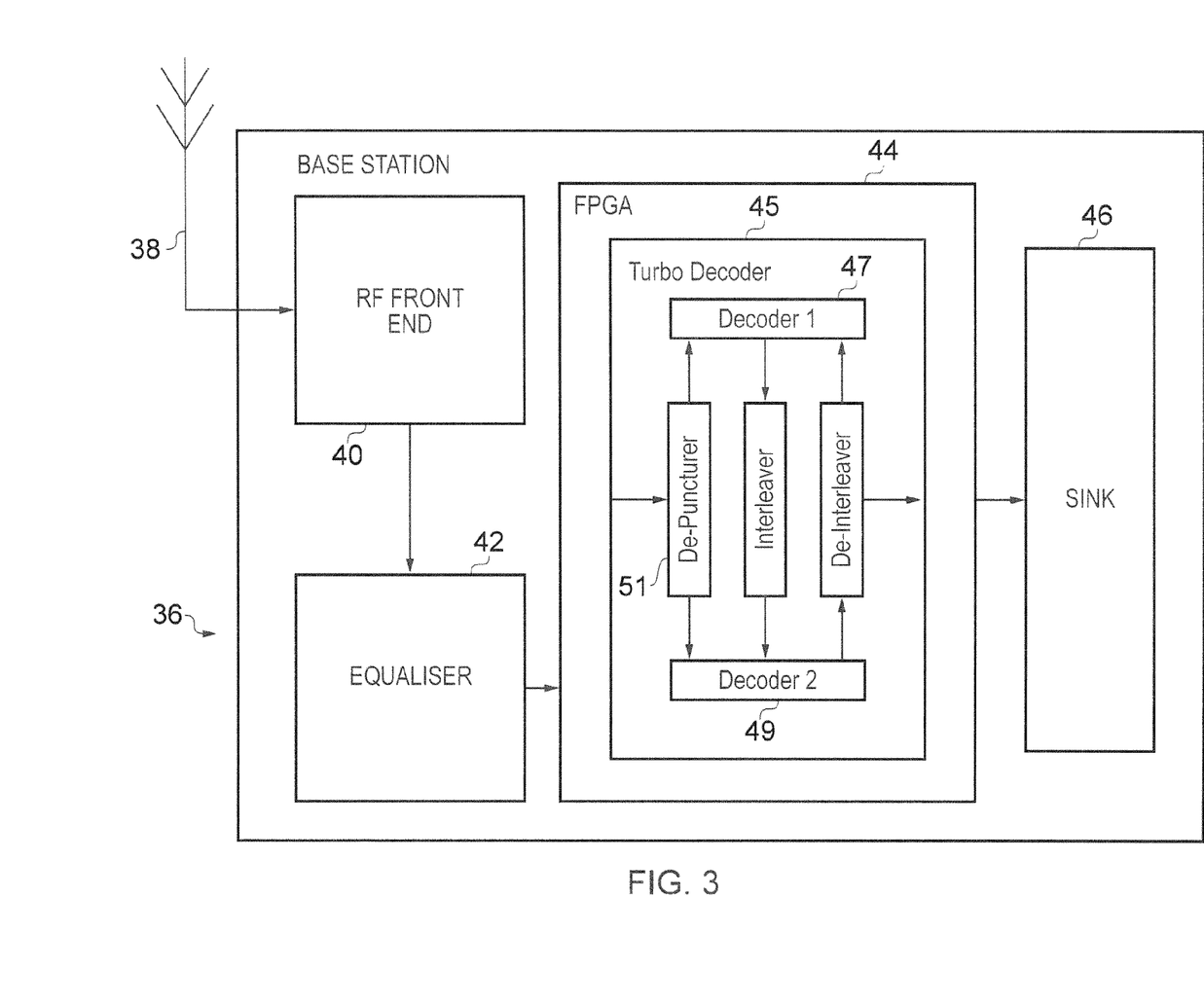
FIG. 3 is a block diagram illustrating schematically a base station, which is in a UMTS (universal mobile telecommunications system) network.

FIG. 3 is a block diagram schematically illustrating a base station 36, which is in a UMTS network (not shown). The base station 36 is shown in FIG. 3 from the perspective of its role as a signal receiver and is shown comprising an antenna 38, an RF front end module 40, an equaliser 42, an FPGA 44 and an information sink 46. It will be apparent to readers skilled in the digital communications field that elements 40, 42 and 46 shown in FIG. 3 represent functions that are implemented within the base station 36 and do not necessarily correspond directly to actual components of the base station.

Consider the case where the base station 36 is tasked with recovering a data signal that has been turbo encoded and modulated onto an RF carrier signal that has been transmitted over the air to the base station. The antenna 38 picks up radio signals in the vicinity of the base station 36 and supplies them to the RF front end module 40 for processing. The RF front end module 40 uses filtering to isolate the wanted RF carrier signal from amongst the signals collected by the antenna 38. The RF front end module amplifies the isolated RF carrier signal, demodulates it (for example by direct downconversion) and digitally samples the result to produce a series of digital symbols representing an estimate of the turbo encoded data signal. However, this estimate is likely to be affected by intersymbol interference (ISI) arising from multipath propagation of the desired RF carrier signal between its point of origin and the antenna 38. Accordingly, the estimate of the turbo encoded signal is fed through the equaliser 42 which attempts to eliminate any ISI that is present within the estimate of the turbo encoded signal. The equalised estimate of the turbo encoded signal is then supplied from the equaliser 42 to the FPGA 44, which is configured to implement a turbo decoder 45 for estimating the data signal that produced the estimated turbo encoded signal. The recovered data signal is then applied to the information sink 46, where it is put to its intended use, whatever that may be. For example, the information sink 46 may represent an interface to a core network through which the recovered data signal is to be conveyed.

The turbo decoder 45 that is implemented by the FPGA 44 has the same structure as the turbo decoder 14 described with reference to FIG. 1. The constituent decoders 47 and 49 within turbo decoder 45 each employ the max-log-MAP algorithm to generate, in the case of constituent decoder 47, LLR estimates of the data signal that produced the estimated turbo encoded signal and, in the case of constituent decoder 49, LLR estimates of the interleaved version of that data signal. The FPGA 44 is configured to perform the various mathematical functions that are required in the turbo decoder 45 and, in particular, the aforementioned MUOs and LLR calculations.

Figure 4:
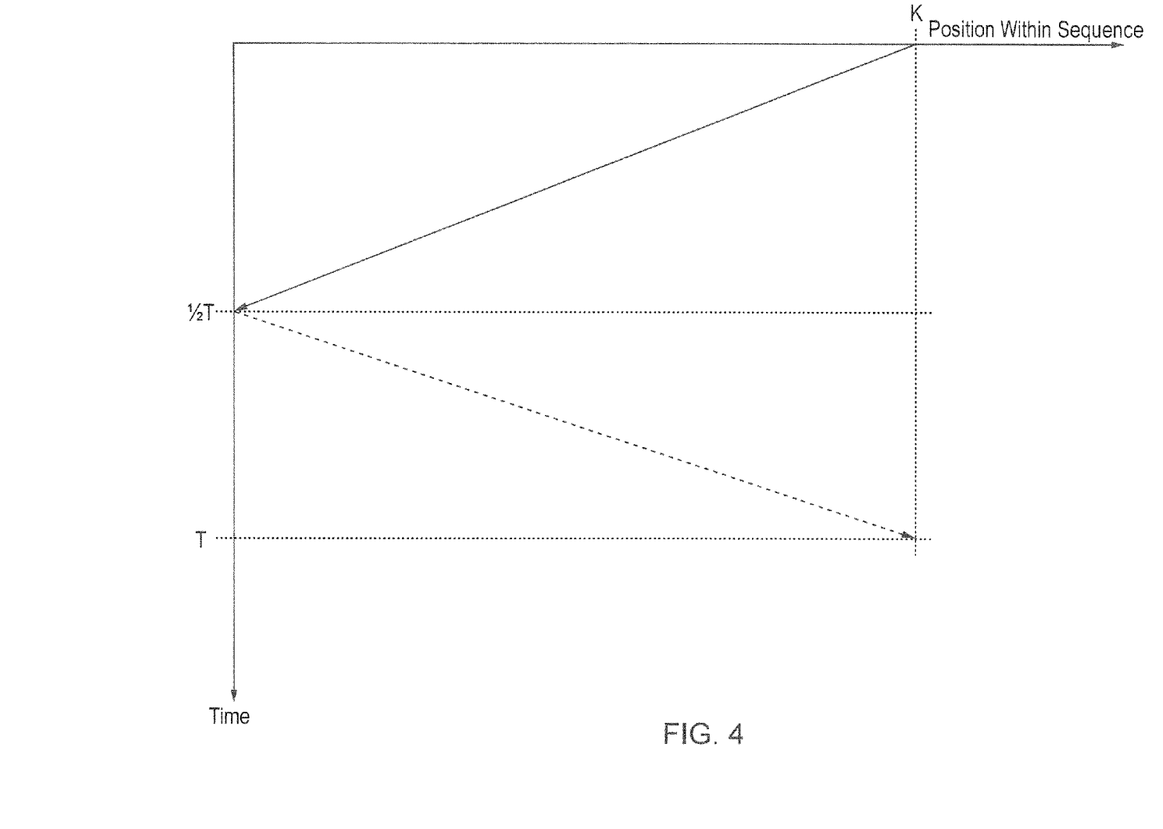
FIG. 4 illustrates a classical max-log-MAP sequence estimation approach.

FIG. 4 is an execution timing diagram for a classical approach to performing max-log-MAP signal estimation. FIG. 4 relates to the case where the data signal that is being estimated is K symbols long. The position on the horizontal axis specifies the symbol that is currently being operated on and the position on the vertical axis specifies the time point within the max-log-MAP process. The origin point of the axes specifies the first symbol of the sequence and the first clock cycle of the execution of the max-log-MAP process. The solid arrow denotes a β metric calculation process and the dashed arrow denotes the performance of α metric and LLR calculation processes in parallel. The same conventions are adopted in FIGS. 5 and 6.

In the classical max-log-MAP approach depicted in FIG. 4, first of all, the β metrics are calculated, and this takes up until time T/2 (where T is the time it takes to produce the full set of LLRs for the K symbols of the data signal). The β metrics are stored into a memory (not shown) as they are calculated. Next, the α metrics are calculated. As each α metric is produced, it is used with its corresponding β metric (duly retrieved from memory) in the LLR calculation process to render an LLR for the data sequence symbol to which the α metric relates. Thus, the α metric and LLR calculation processes proceed in parallel and terminate together at time T. Hardware for performing max-log-MAP signal estimation can be regarded as a "decoding engine" and in the case of the FIG. 4 approach, the decoding engine would have a clock rate of 2K/T symbols per second, this being the rate of production of α metrics, β metrics and LLRs.

Figure 5:
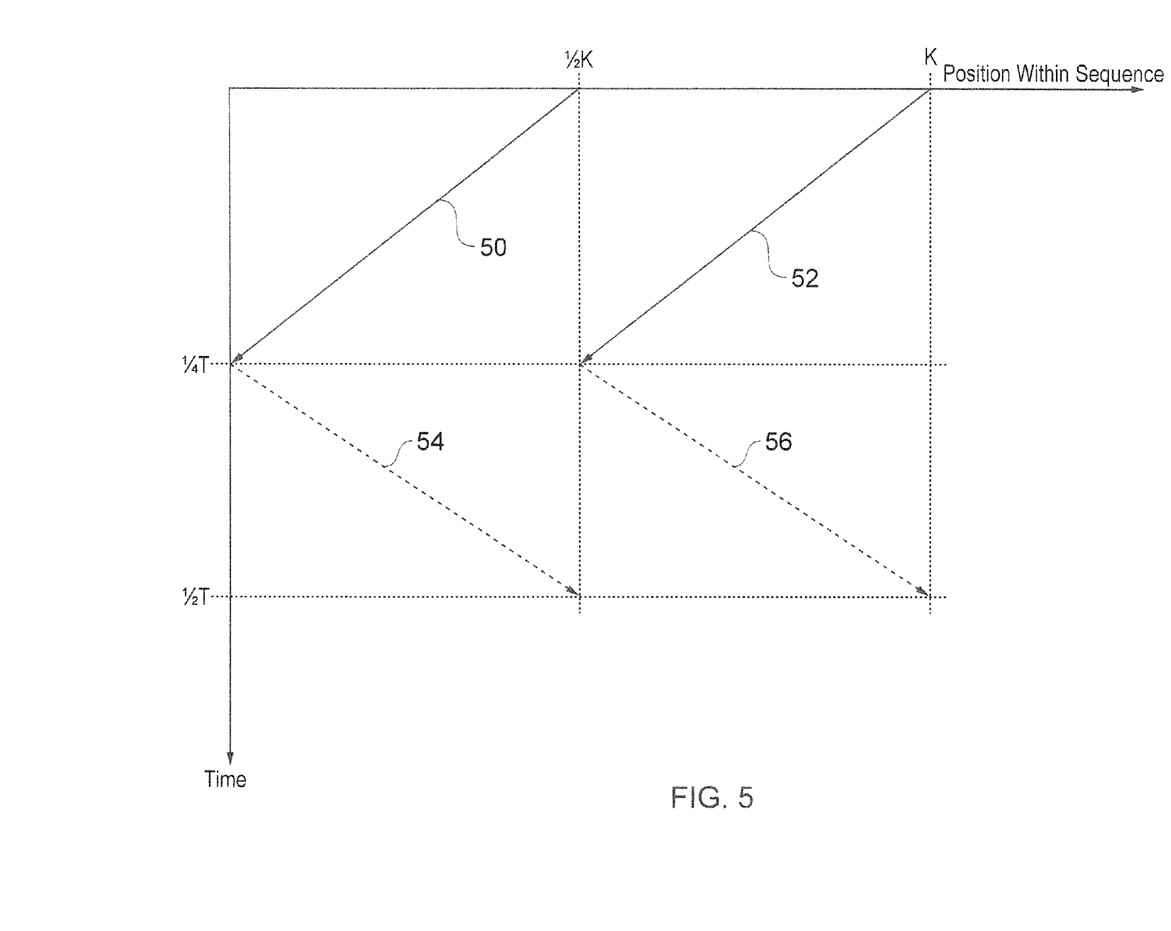
FIG. 5 illustrates a modification of the max-log-MAP sequence estimation approach of FIG. 4 to use parallel decoding engines.

FIG. 5 shows how the time taken to perform max-log-MAP signal estimation can be halved by adopting the known approach of using two parallel decoding engines, in this case each having the same clock rate as the decoding engine used in FIG. 4. In this case, one of the decoding engines performs α metric, β metric and LLR calculation processes on a first sub-block of the data signal, covering symbols 1 to K/2 and the other decoding engine performs the same tasks for a second sub-block covering symbols K/2+1 to K. Therefore, processes in the half of the FIG. 5 covering the region 1 to K/2 along the horizontal axis are processes performed by the first engine and processes in the half of the FIG. 5 covering the region K/2+1 to K along the horizontal axis are processes performed by the second engine. It will be apparent that both engines complete their β metric calculations at time T/4 (solid arrows 50 and 52) and that they then go on to perform their α metric and LLR calculations, which complete at time T/2 (dashed arrows 54 and 56).

Figure 6:
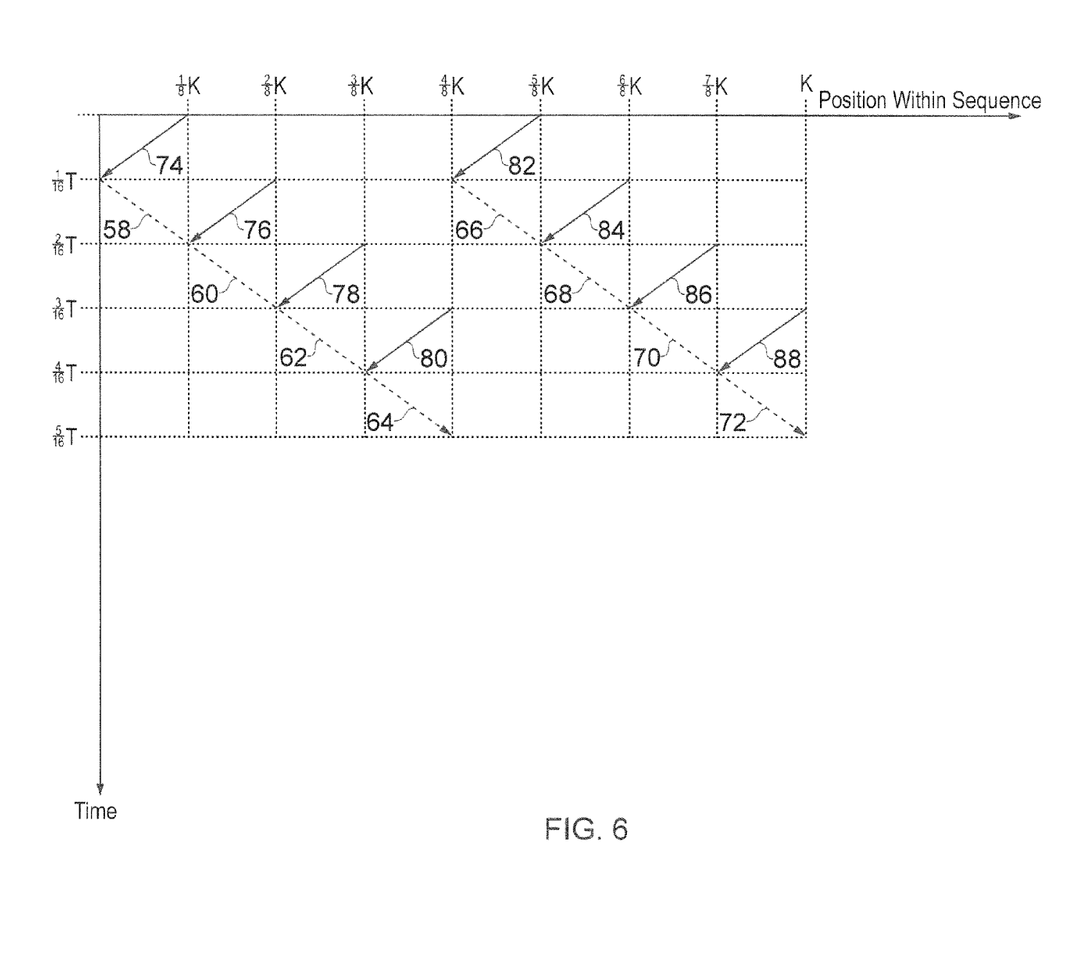
FIG. 6 illustrates a modification of the max-log-MAP sequence estimation approach of FIG. 5 to use a windowing technique within the parallel decoding engines.

An explanation shall now be given of the max-log-MAP decoding process by which constituent decoder 47 re-estimates the data signal that produced the estimated turbo encoded signal. The schemes shown in FIGS. 4 and 5 are relatively memory intensive compared to the scheme that is employed in constituent decoder 47, which is shown in FIG. 6. As will be understood by the skilled person, the max-log-MAP signal estimation approach of FIG. 6 is performed in each turbo decoding iteration. In the first turbo decoding iteration, the constituent decoder 47 operates on an "existing estimate" in the shape of the data signal estimate that is furnished by the depuncturer 51. In all subsequent turbo decoding iterations, the constituent decoder operates on an "existing estimate" that is a de-interleaved version of the output of constituent decoder 49.

As in the FIG. 5 approach, two parallel decoding engines are used in the FIG. 6 approach, one engine operating on a sub-block running from symbols 1 to K/2 and the other operating on a second sub-block covering symbols K/2+1 to K. It is also assumed for the sake of convenience that these decoding engines operate at the same clock rate as those involved in the FIGS. 4 and 5 approaches. In the FIG. 6 approach, a windowing technique is used within each of the sub-blocks, as will now be explained.

According to the FIG. 6 approach, the sub-block covering symbols 1 to K/2 is divided into first to fourth windows, which respectively cover symbols 1 to K/8, K/8+1 to 2K/8, 2K/8+1 to 3K/8, and 3K/8+1 to 4K/8. Likewise, the sub-block covering symbols K2+1 to K is divided into fifth to eighth windows, which respectively cover symbols 4K/8+1 to 5K/8, 5K/8+1 to 6K/8, 6K/8+1 to 7K/8, and 7K/8+1 to K. Thus, only two series of K/8 β metrics need be stored, as compared with two series of K/2 β metrics in the FIG. 5 approach. The various processes performed in these windows will now be specified.

In the time period covering clock cycles 1 to T/16:
the β metrics for the first window and fifth windows are calculated.

In the time period covering clock cycles T/16+1 to 2T/16:
the β metrics for the second and sixth windows are calculated.
the α metrics and LLRs for the first and fifth windows are calculated.

In the time period covering clock cycles 2T/16+1 to 3T/16:
the β metrics for the third and seventh windows are calculated.
the α metrics and LLRs for the second and sixth windows are calculated.

In the time period covering clock cycles 3T/16+1 to 4T/16:
the β metrics for the fourth and eighth windows are calculated.
the α metrics and LLRs for the third and seventh windows are calculated.

In the time period covering clock cycles 4T/16+1 to 5T/16:
the α metrics and LLRs for the fourth and eighth windows are calculated.

Of course, this sequence of processing operations will be evident to readers skilled in the digital data communications arts upon inspecting the execution timing diagram of FIG. 6. The sliding windows have a fixed length S (32 is a typical value) except sometimes in the case of the final sliding window of a sub-block. That is to say, the length of the final sliding window of a sub-block will differ from S in the case where the length of a sub-block is not an integer multiple of S. (Here, the length of a sub-block is K/P, where P is the number of parallel decoding engines within the constituent decoder.)

When commencing the calculation of metrics, of either the α or β class, a set of initial metric values of the relevant class must be provided for the starting point of the relevant arrow in FIG. 6.

In the case of the α metrics, the provision of an initial metric set is straightforward within the sub-block running from symbols 1 to K/2, since the set of α metric values for the start of process 58 are known by design, the set of α metric values for the start of process 60 is the set of α metric values from the end of process 58, the set of α metric values for the start of process 62 is the set of α metric values from the end of process 60, and the set of α metric values for the start of process 64 is the set of α metric values from the end of process 62.

Within the sub-block running from symbols K/2+1 to K, the process is slightly different because the α metrics at the start of process 66 are not known by design and cannot be inherited from process 64 because process 66 starts at time T/16+1, whereas process 64 does not finish until time 5T/16. Accordingly, the α metrics of process 66 are instead initialised with the final α metric values that were produced for process 64 in the previous turbo decoding iteration. This means of course that the set of α metric values at the end of process 64 must, in all but the final turbo decoding iteration, be saved for later re-use. Of course, in the case of the first turbo decoding iteration, where the "existing estimate" on which the FIG. 6 approach is operating is the initial version as supplied by the depuncturer 51, then there is no saved set of α metric values with which to prime process 66. In such a case, default values are used for the initial α metrics of process 66. As regards process 68, this can of course be primed with the final α metric values developed in process 66 in the current iteration of the FIG. 6 approach, and likewise for the initial α metric values of processes 70 and 72.

The manner in which the β metric values are primed in the FIG. 6 approach will now be described.

The β metric calculation processes in FIG. 6 are denoted by the arrows 74 to 88. The β metrics for the commencement of process 88 are known by design, but this is not the case for processes 74 to 86. Accordingly, process 74 is initialised with the β metrics developed at the end of process 76 in the preceding turbo decoding iteration. Likewise, processes 76, 78, 82, 84 and 86 are initialised with the β metric sets that where obtained in the previous turbo decoding iteration for the endpoints of processes 78, 80, 84, 86 and 88, respectively. Of course, this re-use of previous-iteration β metrics is not possible for the first iteration of the FIG. 6 approach and default β metrics need to be used instead.

The initialisation of β metric calculation process 80 is conducted somewhat differently. Rather than use a set of β metrics stored during an earlier turbo decoding iteration, the β metrics used for the start of process 80 are the set of β metrics that are produced at the end of process 82 within the current turbo decoding iteration. To emphasise the point, the set of β metrics that is produced at the end of process 82 at time T/16 is stored and then retrieved for use in calculating the set of β metrics for the start of process 80 a period of time T/8 later. Thus, the processing of symbols 5K/8 to 4K/8+1 in process 82 can from one perspective be regarded as the processing of a training sequence to produce for the start of process 80 more accurate β metrics than would simply be obtained by mere re-use of the final β metric set produced by process 82 in the previous turbo decoding iteration.

Figure 7:
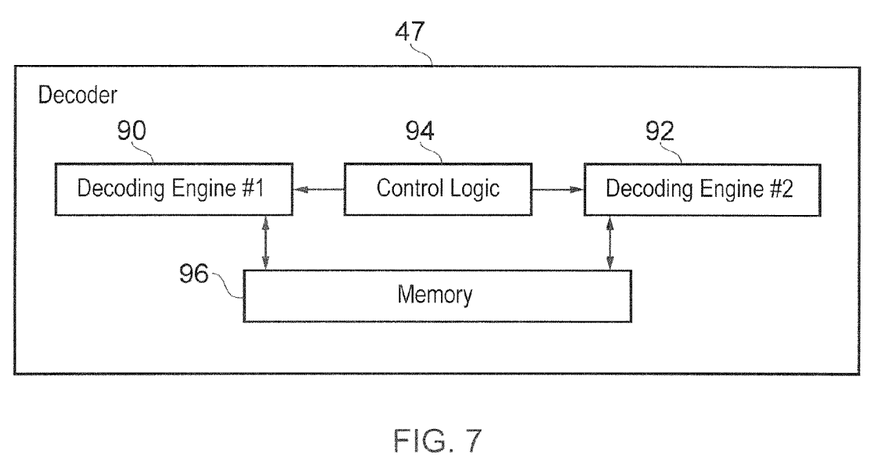
FIG. 7 is a block diagram of one of the constituent decoders of the turbo decoder within the base station of FIG. 3.

The implementation of constituent decoder 47 is outlined in FIG. 7. There, constituent decoder 47 is shown as comprising two decoding engines 90 and 92, control logic 94 and memory 96. Decoding engine 90 performs the max-log-MAP processing associated with the part of FIG. 6 that covers symbols 1 to K/2 of the transmitted signal (so processes 58 to 64 and 74 to 80) and decoding engine 92 performs the max-log-MAP processing associated with the part of FIG. 6 that covers K/2+1 to K (so processes 66 to 72 and 82 to 88). The memory 96 provides somewhere to store metrics that are being used by the decoding engines 90 and 92. The control logic 94 controls the operation of the decoding engines 90 and 92 and, amongst other things, directs the saving into memory 96 of the β metrics at the end of process 82 and also the retrieval of those β metrics for the initialisation of process 80 later in the same turbo decoding iteration.

Constituent decoder 49 operates in a manner analogous to constituent decoder 47. That is to say, constituent decoder also performs max-log-MAP sequence estimation in each turbo decoding iteration using the approach outlined above with reference to FIG. 6.

The benefit that is achieved by initialising process 80 with the final β metrics of the performance of process 82 within the current turbo decoding iteration occurs at the boundary between the processes that are handled by the different decoding engines. The constituent decoders 47 and 49 each use two parallel decoding engines but it is of course possible to use a greater number of parallel decoding engines, depending on the precise implementation required. If the number of parallel decoding engines within a constituent decoder is increased, then the technique of re-using end-point β metrics within a single turbo decoding iteration can be implemented at each decoding engine boundary.

Figure 8:
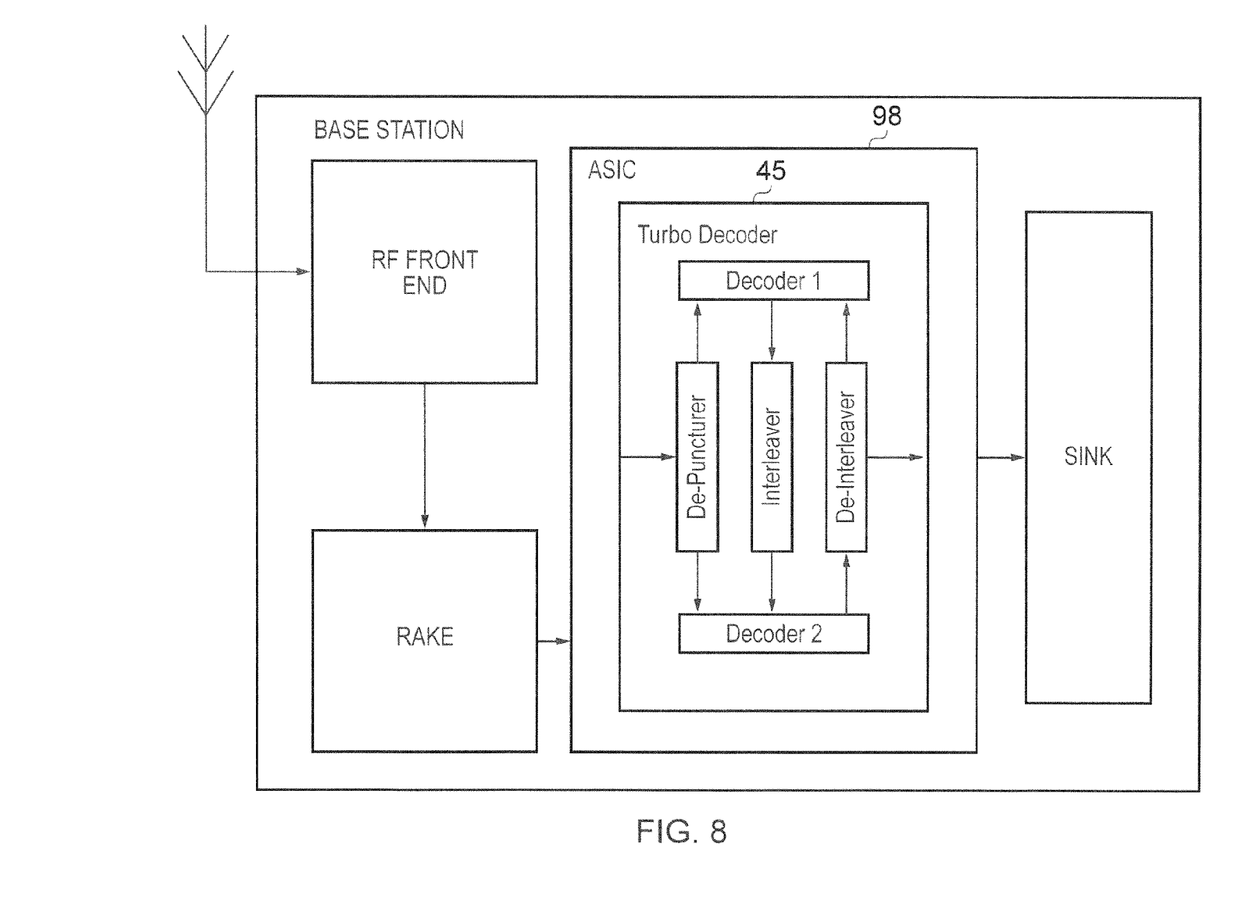
FIG. 8 illustrates a UMTS base station implementing, in an ASIC, a turbo decoder having constituent decoders of the type described with reference to FIG. 7.

So far, this document has discussed turbo decoder designs implemented in FPGAs. Of course, it will be apparent to readers skilled in the digital communications field that the turbo decoder designs described in this document could be implemented in other data processing technologies. FIG. 8 provides an example of this, where the turbo decoder 45 of FIG. 3 is implemented in an ASIC 98 instead of an FPGA.

Figure 9:
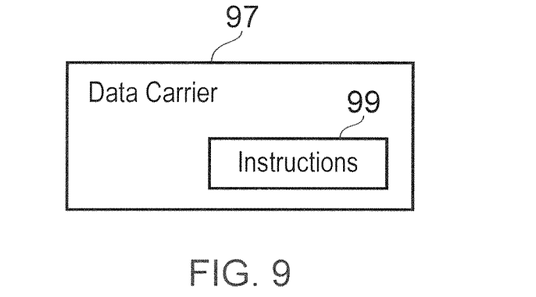
FIG. 9 illustrates a block diagram of a data carrier containing instructions for performing embodiments of methods of the present invention.

FIG. 9 illustrates a block diagram of a data carrier containing instructions for performing embodiments of methods of the present invention. In FIG. 9, data carrier 97 contains instructions 99 for performing embodiments of methods of the present invention. In one embodiment, the instructions 99 are for causing a data processing equipment (e.g., an FPGA or an ASIC) to perform embodiments of the sequence estimation method of the present invention. The data carrier 97 may be any suitable medium that may contain such instructions. In one embodiment, the medium is a memory device for storing such instructions. In another embodiment, the medium may be a medium for transmitting signals over a wireless or wired communications network.

The constituent decoder designs discussed in the Detailed Description up to this point utilise the max-log-MAP algorithm. However, these designs are readily adapted to a log-MAP or a MAP algorithm, and the necessary modifications will be apparent to persons skilled in the field of digital communications.

This document has discussed architectures for constituent decoders in a turbo decoder but it is to be understood that these convolutional decoder architectures are not limited in applicability to the field of turbo decoding.

This document has discussed data processing techniques for data recovery in the context of signals acquired by a base station but it will be appreciated that these techniques are not limited to this context. For example, the data processing techniques described in this document could be applied in the context of a mobile telephone handset acquiring a convolutionally encoded signal or a convolutionally encoded signal read from a hard disk drive.

While the present invention has been particularly described with respect to the illustrated embodiments, it will be appreciated that various alterations, modifications and adaptations may be made based on the present disclosure, and are intended to be within the scope of the present invention. While the invention has been described in connection with what are presently considered to be the most practical and preferred embodiments, it is to be understood that the present invention is not limited to the disclosed embodiments but, on the contrary, is intended to cover various modifications and equivalent arrangements included within the scope of the appended claims.

What is claimed is:

1. A sequence estimator for re-estimating a transmitted signal from an existing estimate of the transmitted signal, the sequence estimator comprising:
   a) a plurality of decoding engines;
   b) control logic; and
   c) a memory;

wherein:
   d) each decoding engine is arranged to re-estimate in series a plurality of sections of the transmitted signal;
   e) each decoding engine, in producing a new estimate of a given section of the transmitted signal, is arranged to perform on the existing estimate of the given section a type of maximum a posteriori probability (MAP) decoding in which state metrics of first and second types are calculated through the given section in opposing directions;
   f) the control logic is arranged to store into the memory the second type state metrics as produced by a first one decoding engine of said plurality of decoding engines for an end-point of a first one section of said plurality of sections; and
   g) the control logic is arranged to retrieve said second type state metrics stored in the memory and use them to initialize calculation of second type state metrics in a second one decoding engine of the plurality of decoding engines for a second one section of said plurality of sections, wherein initialization of the calculation of the second type state metrics for the second one section and production of the second type state metrics for the end-point of the first one section occur in one iteration of re-estimating the transmitted signal, further wherein initialization of calculation of first type state metrics for the first one section of said plurality of sections and production of the first type state metrics for an end-point of the second one section occur in different iterations of re-estimating the transmitted signal.

2. A sequence estimator according to claim 1, wherein the control logic is arranged to store into the memory the second type state metrics as produced by one decoding engine of said plurality of decoding engines for an end-point of one section of said plurality of sections for use in initializing calculation of second type metrics for the one section by the one decoding engine in a subsequent iteration of re-estimating the transmitted signal.

3. A sequence estimator according to claim 1, wherein the first and second metric types are α and β metrics, respectively, of a MAP algorithm.

4. A field programmable gate array (FPGA) in which is implemented a sequence estimator according to claim 1.

5. An application specific integrated circuit (ASIC) in which is implemented a sequence estimator according to claim 1.

6. A base station of a cellular telecommunications network comprising a sequence estimator according to claim 1.

7. A turbo decoder comprising a sequence estimator according to claim 1.

8. An integrated circuit (IC) comprising a sequence estimator comprising a plurality of maximum a posteriori probability (MAP) decoding engines each arranged to process a series of windows of a transmitted signal wherein state metrics produced for an end of one window by one decoding engine are re-used for initialization of a state metric calculation process performed by another decoding engine on another window of said transmitted signal, wherein initialization of a second type state metric calculation on the another window and production of second type state metrics for the end of the one window occur in one iteration of estimating the transmitted signal, further wherein initialization of calculation of a first type state metric for the one window and production of first type state metrics for an end-point of the another window occur in different iterations of re-estimating the transmitted signal.

9. A method of re-estimating a transmitted signal from an existing estimate of the transmitted signal using a plurality of decoding engines, the method comprising:
  a) re-estimating in series in each decoding engine a plurality of sections of the transmitted signal, wherein, each decoding engine, in producing a new estimate of a given section of the transmitted signal, is arranged to perform on the existing estimate of the given section a type of maximum a posteriori probability (MAP) decoding in which state metrics of first and second types are calculated through the given section in opposing directions;
  b) storing into a memory the second type state metrics as produced by a first one decoding engine of said plurality of decoding engines for an end-point of a first one section of said plurality of sections; and
  c) retrieving said second type state metrics stored in the memory and using them to initialize calculation of second type state metrics in a second one decoding engine of the plurality of decoding engines for a second one section of said plurality of sections, wherein initialization of the calculation of the second type state metrics for the second one section and production of the second type state metrics for the end-point of the first one section occur in one iteration of re-estimating the transmitted signal, further wherein initialization of calculation of first type state metrics for the first one section of said plurality of sections and production of the first type state metrics for an end-point of the second one section occur in different iterations of re-estimating the transmitted signal.

10. A method according to claim 9, further comprising storing into the memory the second type state metrics as produced by one decoding engine of said plurality of decoding engines for an end-point of one section of said plurality of sections for use in initializing calculation of second type state metrics for the one section by the one decoding engine in a subsequent iteration of re-estimating the transmitted signal.

11. A method according to claim 9, wherein the first and second metric types are $\alpha$ and $\beta$ metrics, respectively, of a MAP algorithm.

12. A method of turbo-decoding a received signal comprising a signal re-estimation method according to claim 9.

13. A non-transitory data carrier containing instructions for causing data processing equipment to perform a sequence estimation method according to claim 9.

14. A method of estimating a sequence using a plurality of maximum a posteriori probability (MAP) decoding engines each arranged to process a series of windows of a transmitted signal, the method comprising producing in one decoding engine state metrics for an end of one window and re-using said state metrics for initialization of a state metric calculation process performed by another decoding engine on another window of said transmitted signal, wherein the re-using said state metrics for initialization of a second type state metric calculation and producing second type state metrics for the end of the one window occur in one iteration of estimating the transmitted signal, further wherein initialization of calculation of a first type state metric for the one window and production of first type state metrics for an end-point of the another window occur in different iterations of re-estimating the transmitted signal.

15. A non-transitory data carrier containing instructions for causing data processing equipment to perform a sequence estimation method according to claim 14.

16. An IC according to claim 8, wherein the state metrics are $\alpha$ state metrics of a MAP algorithm.

17. An IC according to claim 8, wherein the state metrics are $\beta$ state metrics of a MAP algorithm.

18. A method according to claim 14, wherein the state metrics are $\alpha$ state metrics of a MAP algorithm.

19. A method according to claim 14, wherein the state metrics are $\beta$ state metrics of a MAP algorithm.

20. An IC according to claim 8, wherein the IC is a field programmable gate array (FPGA).

21. An IC according to claim 8, wherein the IC is an application specific integrated circuit (ASIC).

* * * * *